US011768413B2

(12) United States Patent
Wu et al.

(10) Patent No.: US 11,768,413 B2
(45) Date of Patent: Sep. 26, 2023

(54) ARRAY SUBSTRATE, DISPLAY PANEL, DISPLAY DEVICE, AND DRIVING METHOD

(71) Applicant: Xiamen Tianma Micro-Electronics Co., Ltd., Xiamen (CN)

(72) Inventors: Changzhi Wu, Xiamen (CN); Ying Sun, Xiamen (CN); Yumin Xu, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 224 days.

(21) Appl. No.: 17/418,130

(22) PCT Filed: Jul. 1, 2020

(86) PCT No.: PCT/CN2020/099677
§ 371 (c)(1),
(2) Date: Jun. 24, 2021

(87) PCT Pub. No.: WO2021/237874
PCT Pub. Date: Dec. 2, 2021

(65) Prior Publication Data
US 2022/0334440 A1 Oct. 20, 2022

(30) Foreign Application Priority Data

May 29, 2020 (CN) .......................... 202010478480.8

(51) Int. Cl.
*G02F 1/1362* (2006.01)
*G09G 3/3266* (2016.01)
(Continued)

(52) U.S. Cl.
CPC ..... *G02F 1/136286* (2013.01); *G09G 3/3266* (2013.01); *G09G 3/3677* (2013.01);
(Continued)

(58) Field of Classification Search
CPC ..................................................... G02F 1/1362
See application file for complete search history.

(56) References Cited

U.S. PATENT DOCUMENTS

| 2007/0165149 A1* | 7/2007 | Kim ................. G02F 1/134336 349/39 |
| 2013/0293529 A1* | 11/2013 | You ......................... G09G 3/20 345/212 |

(Continued)

FOREIGN PATENT DOCUMENTS

| CN | 103928002 A | 7/2014 |
| CN | 105759524 A | 7/2016 |

(Continued)

OTHER PUBLICATIONS

International Search Report related to Application No. PCT/CN2020/099677; dated Feb. 18, 2021.

(Continued)

*Primary Examiner* — Sang V Nguyen
(74) *Attorney, Agent, or Firm* — von Briesen & Roper, s.c.

(57) ABSTRACT

Provided are an array substrate, a display panel, a display device, and a driving method. The array substrate includes a plurality of pixel circuit rows arranged in sequence in a column direction, where each pixel circuit row includes a plurality of pixel circuits arranged in a row direction; and a plurality of scan line groups arranged in sequence in the column direction, where the scan line groups are in one-to-one correspondence with the pixel circuit rows. The each pixel circuit row includes a plurality of pixel circuit groups. Each scan line group includes a plurality of scan lines. Each scan line extends in the row direction. The pixel circuit groups are in one-to-one correspondence with the scan lines in a scan line group corresponding to the pixel circuit groups.

15 Claims, 8 Drawing Sheets

(51) Int. Cl.
  *G09G 3/36*    (2006.01)
  *H10K 59/131*  (2023.01)
  *H10K 59/35*   (2023.01)

(52) U.S. Cl.
  CPC ......... *H10K 59/131* (2023.02); *H10K 59/353* (2023.02); *G09G 2310/0286* (2013.01)

(56) References Cited

U.S. PATENT DOCUMENTS

2016/0155400 A1    6/2016  Namkung et al.
2017/0343844 A1   11/2017  Aoki
2020/0355970 A1*  11/2020  Cheng ............... G02F 1/136286

FOREIGN PATENT DOCUMENTS

| CN | 107065366 | A | 8/2017 | | |
| CN | 109188806 | A | 1/2019 | | |
| CN | 110060652 |   | * | 7/2019 | ............... G09G 3/36 |
| CN | 110060652 | A | 7/2019 | | |
| JP | 2017530411 | A | 10/2017 | | |

OTHER PUBLICATIONS

Chinese Office Action for related Application No. 202010478480.8.
Chinese Search Report for related Application No. 202010478480.8.

* cited by examiner

ARRAY SUBSTRATE, DISPLAY PANEL, DISPLAY DEVICE, AND DRIVING METHOD

CROSS-REFERENCE TO RELATED APPLICATION

This is a National Stage Application filed under 35 U.S.C. 371 based on International Patent Application No. PCT/CN2020/099677, filed on Jul. 1, 2020, which claims priority to Chinese Patent Application No. 202010478480.8 filed on May 29, 2020, the disclosures of both of which are incorporated herein by reference in their entireties.

TECHNICAL FIELD

The present application relates to the field of display technology, for example, an array substrate, a display panel, a display device, and a driving method.

BACKGROUND

With the development of display technology, display devices such as liquid crystal panels and displays are developing towards lightness and thinness, large screen, low power consumption, and high definition.

In a display panel having an increasingly large size and an increasingly high resolution, a growing number of pixels in a same row need to be connected to each scan line. Thin-film transistors in pixels are turned on through scan lines. Then data signals are provided for the pixels in the row sequentially through data lines. In this case, when the pixels are being charged, scan signals provided through the scan lines cause a charging delay due to overload. As a result, the display effect of the pixels is affected.

SUMMARY

The present application provides an array substrate, a display panel, a display device, and a driving method to avoid overload of scan lines, reduce charging delay, and ensure the display effect.

An embodiment of the present disclosure provides an array substrate. The array substrate includes a plurality of pixel circuit rows arranged in sequence in the column direction, where each pixel circuit row includes a plurality of pixel circuits arranged in the row direction; and a plurality of scan line groups arranged in sequence in the column direction, where the scan line groups are in one-to-one correspondence with the pixel circuit rows.

Each pixel circuit row includes a plurality of pixel circuit groups. Each scan line group includes a plurality of scan lines. Each scan line extends in the row direction. The pixel circuit groups are in one-to-one correspondence with the scan lines in a scan line group corresponding to the pixel circuit groups. All pixel circuits in the same pixel circuit group are connected to the same scan line in a scan line group corresponding to the same pixel circuit group.

The scan line groups provide scan signals sequentially for the pixel circuit rows in one-to-one correspondence with the scan line groups. The scan lines in the same scan line group provide scan signals simultaneously for pixel circuits connected to the scan lines.

An embodiment of the present disclosure further provides a driving method of a display panel. The method includes providing scan signals for a plurality of pixel circuit rows sequentially through different scan line groups; and providing same scan signals for pixel circuits in the same pixel circuit row simultaneously through a plurality of scan lines in the same scan line group.

An embodiment of the present disclosure further provides a display panel. The display panel includes the array substrate of the embodiment of the present disclosure.

An embodiment of the present disclosure further provides a display device. The display device includes the display panel of the embodiment of the present disclosure.

DETAILED DESCRIPTION

The present application is described hereinafter in conjunction with drawings and embodiments. The embodiments described herein are intended to explain and not to limit the present application. For ease of description, only part, not all, of structures related to the present application are illustrated in the drawings.

Figure 1:
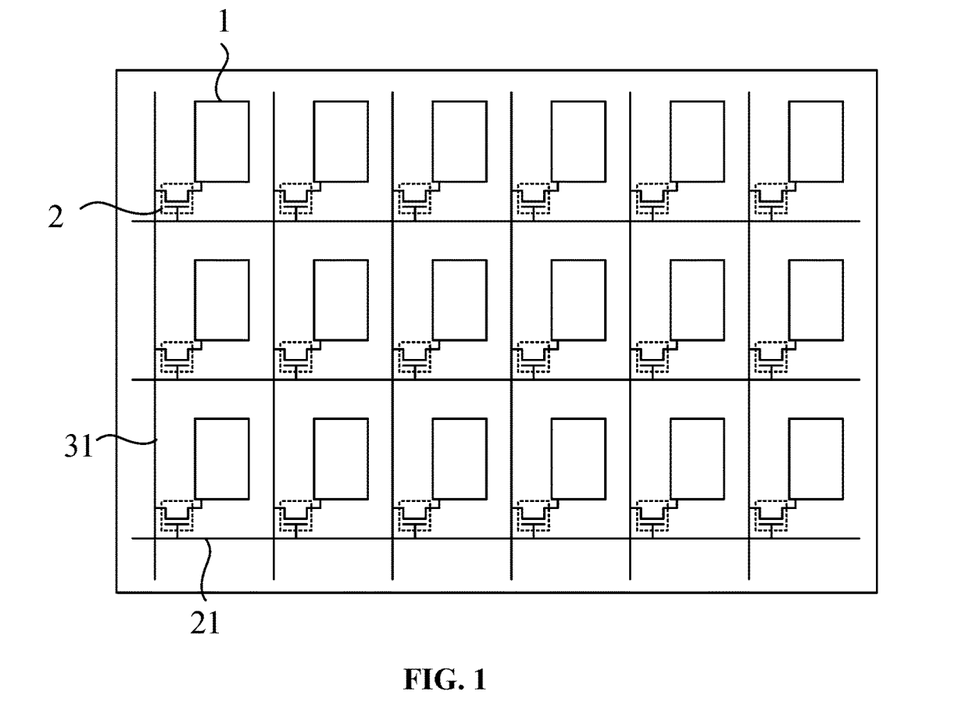
FIG. 1 is a diagram illustrating the structure of a display panel.

FIG. 1 is a diagram illustrating the structure of a display panel. Referring to FIG. 1, the display panel is typically composed of multiple tiny pixels 1 arranged in a matrix, each pixel 1 is connected to one thin-film transistor 2 that is connected to a scan line 21 and a data line 31 to control the voltage of the each pixel 1. In the horizontal direction, the gate electrodes of all thin-film transistors 2 in one row are connected to one scan line 21. When sufficiently large positive voltages are applied to the scan line 21, the voltages can drive all thin-film transistors connected to the scan line to turn on. At this time, pixels 1 of the same row are provided with corresponding voltage signals through data lines 31 in the vertical direction. After charging of the pixels 1 is completed, sufficiently large negative voltages are applied to the scan line 21 to drive the thin-film transistors 2 to turn off. Then the voltages of the pixels 1 remain the same until voltage signals are rewritten next time. In this manner, the charging process of one row of pixels is completed. Then the next scan line 21 is turned on and charged. Such a process is repeated until all video data is written. In this manner, image display is performed.

Since the display panel has an increasingly large size and an increasingly high resolution, when a scan line 21 is connected to too many pixels 1, the scan line 21 is overloaded, and the provided voltage signals cannot satisfy the conditions for turning on some thin-film transistors, affecting the on state of some thin-film transistors, leading to a longer charging duration of pixels corresponding to these thin-film transistors, thus leading to a delay and affecting the charging effect.

In view of the preceding problem, an embodiment of the present disclosure provides an array substrate. The array substrate includes a plurality of pixel circuit rows arranged in sequence in the column direction, where each pixel circuit row includes a plurality of pixel circuits arranged in the row direction; and a plurality of scan line groups arranged in sequence in the column direction, where the scan line groups are in one-to-one correspondence with the pixel circuit rows. The each pixel circuit row includes at least two pixel circuit groups. Each scan line group includes at least two scan lines. Each scan line extends in the row direction. The at least two pixel circuit groups are in one-to-one correspondence with the at least two scan lines in a scan line group corresponding to the pixel circuit groups. All pixel circuits in the same pixel circuit group are connected to the same scan line in a scan line group corresponding to the same pixel circuit group. Different scan line groups provide scan signals for the pixel circuit rows sequentially. The scan lines in the same scan line group provide scan signals simultaneously to pixel circuits connected to the scan lines.

Pixel circuits are circuit structures arranged in an array on the array substrate to drive pixels to emit light. Generally, a pixel circuit is composed of a thin-film transistor, a capacitor, and other components. The pixel circuits are arranged in one-to-one correspondence with the pixels of the display panel. Multiple pixel circuits arranged in one row in the row direction form one pixel circuit row. The scan line groups arranged in one-to-one correspondence with the pixel circuit rows are each composed of multiple scan lines. The scan lines extend in the row direction. The scan line groups and the pixel circuit rows are arranged in the column direction. One pixel circuit row contains at least two pixel circuit groups. Correspondingly, the corresponding scan line group contains at least two scan lines. Each scan line corresponds to one pixel circuit group. Each scan line is connected to all pixel circuits in the same pixel circuit group. That is, all pixel circuits in each pixel circuit group are driven by the same scan line to turn on and off.

When image display is performed, with the configuration in which scan lines in the same scan line group provide scan signals to pixel circuits in the corresponding pixel circuit row simultaneously, it is possible to ensure that pixel circuits in the same row are turned on synchronously. With the configuration in which different scan line groups provide scan signals for multiple pixel circuit rows sequentially, it is possible to ensure that multiple pixel circuit rows are turned on sequentially to charge pixels. In this manner, progressive scanning is performed, and one frame is driven to be displayed. When at least two scan lines in the same scan line group provide scan signals at different times, the total duration for scanning one row of pixel circuits is relatively long. In embodiment of the present disclosure, in the solution in which scan lines in the same scan line group provide scan signals to pixel circuits in one pixel circuit row simultaneously, the total duration for scanning one row of pixel circuits is relatively short. In an embodiment of the present disclosure, on condition that the refresh rate of the display panel remains unchanged, that is, in the case where the scanning duration of each row of pixel circuits is fixed, the scanning duration of each scan line is equal to the total scanning duration of this row of pixel circuits, that is, each pixel circuit can be fully charged in this scanning duration. When different scan lines provide scan signals at different times, for example, in sequence, the scanning duration of the corresponding scan lines is smaller than the total scanning duration of this row of pixel circuits, that is, the scanning duration of pixel circuits on each scan line is relatively short. In this case, the charging effect of pixels is relatively poor, thereby affecting the display effect.

In an embodiment of the present disclosure, pixel circuits in each pixel circuit row may be divided and controlled by scan signals provided by different scan lines to turn on. Compared with the solution in which one scan line is connected to pixel circuits in one pixel circuit row, in an embodiment of the present disclosure, pixel circuits in one pixel circuit row are divided. In this manner, the number of pixel circuits connected to each scan line can be greatly reduced, and thus load on the each scan line is reduced.

In the array substrate of an embodiment of the present disclosure, the array substrate includes a plurality of pixel circuit rows, where each pixel circuit row includes a plurality of pixel circuits arranged in the row direction; and a plurality of scan line groups, where the scan line groups are in one-to-one correspondence with the pixel circuit rows. The each pixel circuit row includes at least two pixel circuit groups. Each scan line group includes at least two scan lines. The at least two pixel circuit groups are in one-to-one correspondence with the at least two scan lines in a scan line group corresponding to the pixel circuit groups. Pixel circuits in the same pixel circuit group are connected to the same scan line. Different scan line groups provide scan signals for the pixel circuit rows sequentially. The scan lines in the same scan line group provide scan signals simultaneously to pixel circuits connected to the scan lines. In this manner, pixel circuits in each pixel circuit row are divided, and the size of load is defined on each scan line. In the array substrate of an embodiment of the present disclosure, the problem of charging delay caused by excessive load of the display panel is solved. With the configuration in which scan signals are provided for pixel circuits through multiple scan lines, it is ensured that each row of pixel circuits have a sufficient charging duration, and pixel circuits can be turned on accurately and timely. In this manner, charging delay of pixels can be avoided, and normal charging of pixels through pixel circuits and normal display of pixels are ensured.

Solutions in embodiments of the present disclosure are described hereinafter in conjunction with drawings in embodiments of the present disclosure.

Figure 2:
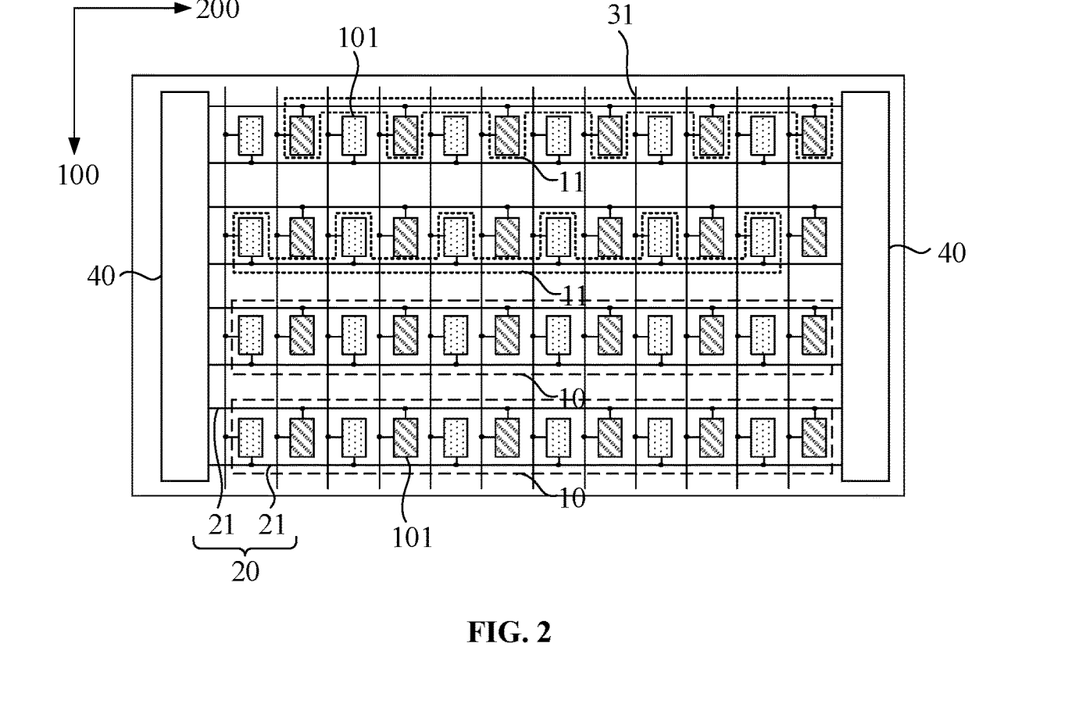
FIG. 2 is a diagram illustrating the structure of an array substrate according to an embodiment of the present disclosure.

FIG. 2 is a diagram illustrating the structure of an array substrate according to an embodiment of the present disclosure. Referring to FIG. 2, the array substrate includes a plurality of pixel circuit rows 10 arranged in sequence in a column direction 100, where each pixel circuit row 10 includes a plurality of pixel circuits 101 arranged in a row direction 200; and a plurality of scan line groups 20 arranged in sequence in the column direction 100, where the scan line groups 20 are in one-to-one correspondence with the pixel circuit rows 10. The each pixel circuit row 10 includes at least two pixel circuit groups 11. Each scan line group 20 includes at least two scan lines 21. Each scan line 21 extends in the row direction 200. The at least two pixel circuit groups 11 are in one-to-one correspondence with the at least two scan lines 21 in a scan line group 20 corresponding to the pixel circuit groups 11. All pixel circuits 101 in the same pixel circuit group 11 are connected to the same scan line 21 in a scan line group 20 corresponding to the same pixel circuit group 11. Different scan line groups 20 provide scan signals for the pixel circuit rows 10 sequentially. The scan lines 21 in the same scan line group 20 provide scan signals simultaneously to pixel circuits 101 connected to the scan lines 21. In an embodiment, in the array substrate shown in FIG. 2, in each pixel circuit row 10, pixel circuits 101 in different pixel circuit groups 11 are arranged alternately in sequence.

As shown in FIG. 2, pixel circuits 101 having the same pattern form one pixel circuit group 11, and each pixel circuit row 10 includes two pixel circuit groups 11. In the array substrate shown in FIG. 2, one scan line group 20 contains two scan lines 21 exemplarily. One scan line group 20 may contain more than two scan lines 21, for example, three scan lines 21 or four scan lines 21. In the example in which one scan line group 20 contains two scan lines 21, the two scan lines 21 are connected to different pixel circuits 101 in the same pixel circuit row 10, and pixel circuits 101 connected to each scan line 21 form one pixel circuit group 11, that is, each pixel circuit row 10 contains two pixel circuit groups 11.

In the display driving process, two scan lines 21 in the same scan line group 20 provide scan signals simultaneously so that all pixel circuits 11 in the pixel circuit row 10 corresponding to this scan line group 20 are turned on. When data signals are provided for this row of pixel circuits 101 sequentially, scanning of one row of pixels is performed. For different rows of pixels, scan signals are provided for multiple pixel circuit rows 10 through different scan line groups 20 sequentially.

In this manner, progressive scanning is performed. After scanning of all rows is completed, the display panel can display one frame.

The array substrate further includes a scan driver circuit 40 electrically connected to scan lines 21 in each scan line group 20. The scan driver circuit 40 provides scan signals to different scan line groups 20 sequentially and provides scan signals to at least two scan lines 21 in the same scan line group 20 simultaneously. In view that pixel circuits 101 in one pixel circuit row 10 are provided with scan signals through one scan line group 20 simultaneously, that is, in the process of scanning one row of pixel circuits 101, it is needed to charge this row of pixel circuits 101 separately and to provide data signals for this row of pixel circuits 101 through different data lines simultaneously. Therefore, pixel circuits 101 in the same row need to be connected to different data lines. With continued reference to FIG. 2, the array substrate is further provided with a plurality of data lines 31. Each data line 31 extends in the column direction 100. Pixel circuits 101 in the same row are connected to different data lines 31.

As can be seen from the array substrate shown in FIG. 2, each row of pixel circuits 101 are divided into two pixel circuit groups 11, that is, the actual load of each scan line 21 is pixel circuits 101 in one pixel circuit group 11. The pixel circuits 101 in the one pixel circuit group 11 are only half of one row of pixel circuits 101. When each scan line 21 provides scan signals, the charging conditions of the pixel circuits 101 to which the each scan line 21 is connected can be satisfied, thereby avoiding the problem of charging delay of pixels and ensuring the display effect of the panel. Moreover, in each pixel circuit row 10, pixel circuits 101 in different pixel circuit groups 11 are arranged alternately in sequence, and when scan signals of scan lines 21 are received, the difference between adjacent pixel circuits 101 connected to different scan lines 21 is small. In this manner, it is possible to ensure that adjacent pixels are similar in display effect and ensure uniform display of the display panel. Additionally, based on the fixed refresh rate of the display panel, each row of pixel circuits 101 have a fixed total scanning duration, and the two scan lines 21 in each scan line group 20 provide scan signals simultaneously, ensuring that the duration in which each scan line 21 provides scan signals is equal to the fixed total scanning duration of each row of pixel circuits 101. Compared with the solution in which the two scan lines 21 provide scan signals alternately, the scanning duration of the two scan lines 21 is half of the total scanning duration of each row of pixel circuits 101. In the array substrate provided in an embodiment of the present disclosure, the charging duration of pixel circuits 101 in each row can be ensured, and each pixel circuit 101 can be charged sufficiently to ensure the charging effect.

Figure 3:
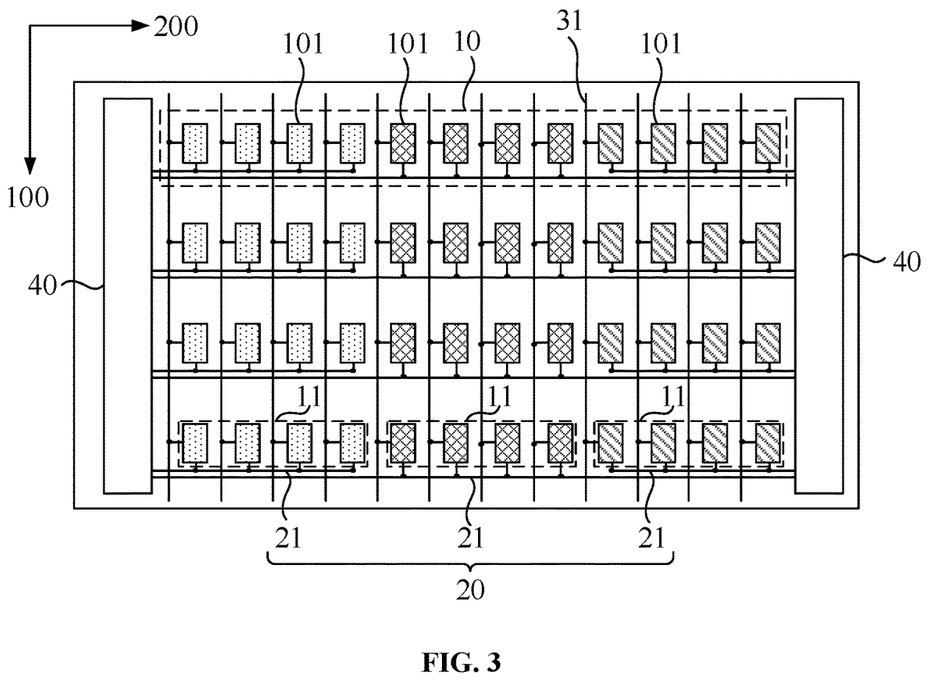
FIG. 3 is a diagram illustrating the structure of another array substrate according to an embodiment of the present disclosure.

FIG. 3 is a diagram illustrating the structure of another array substrate according to an embodiment of the present disclosure. Referring to FIG. 3, in the array substrate, in an embodiment, in each pixel circuit row 10, all pixel circuits 101 in each pixel circuit group 11 are in the same region, and pixel circuits 101 in different pixel circuit groups 11 are in different regions.

In an embodiment, as shown in FIG. 3, each pixel circuit row 10 includes three pixel circuit groups 11, and pixel circuits 101 in the three pixel circuit groups 11 are concentrated in the left region, the intermediate region, and the right region of the array substrate respectively. For pixel circuit groups 11 in the intermediate region, it is feasible to provide the same scan signals at both ends of the corresponding scan line 21, thereby balancing the line impedance of the scan line 21, avoiding attenuation that occurs when scan signals are input from one end, and reducing the difference between scan signals received by pixel circuits 101 connected to the scan line 21.

Figure 4:
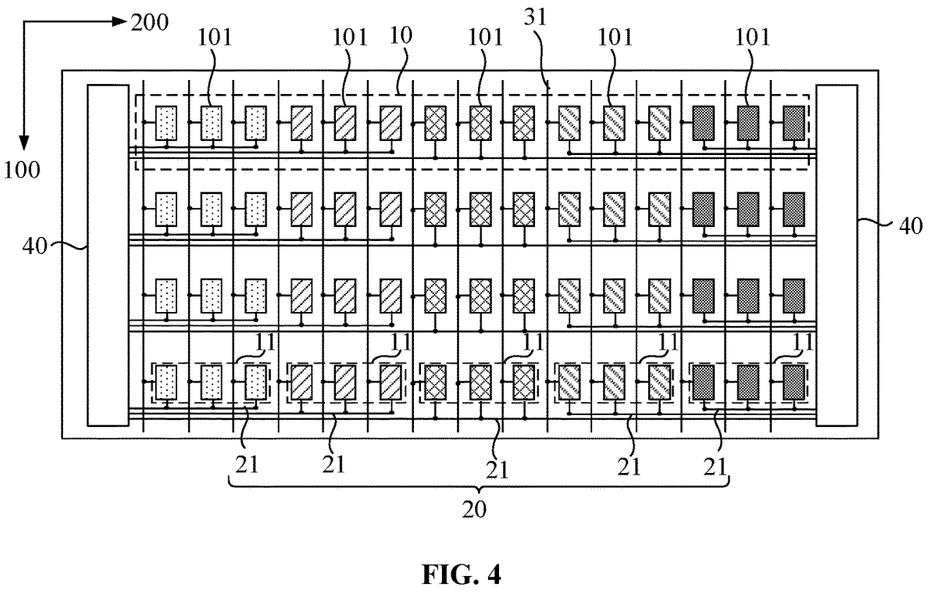
FIG. 4 is a diagram illustrating the structure of another array substrate according to an embodiment of the present disclosure.

In this array substrate, each pixel circuit row 10 may contain two, four, or other number of pixel circuit groups 11. FIG. 4 is a diagram illustrating the structure of another array substrate according to an embodiment of the present disclosure. Referring to FIG. 4, in the array substrate, each pixel circuit row 10 includes five pixel circuit groups 11, and correspondingly, each scan line group 20 is provided with five scan lines 21.

In the array substrate of an embodiment of the present disclosure, the grouping methods of different pixel circuit rows 10 may be the same or different. The grouping method includes the number of groups and the positions and number of pixel circuits 101 in each group. In the array substrate shown in FIG. 3, each pixel circuit row 10 is divided into three pixel circuit groups 11, and the numbers and positions of pixel circuits 101 are the same between the pixel circuit groups 11. In this case, the pixel circuit rows 10 are the same in grouping method. In this manner, it is ensured that scan lines 21 in one scan line group 20 have the same load, thereby avoiding the problem of charging delay of some pixel circuits caused by different loads, enabling scan lines 21 in one scan line group 20 to be charged normally, and ensuring the display effect.

Figure 5:
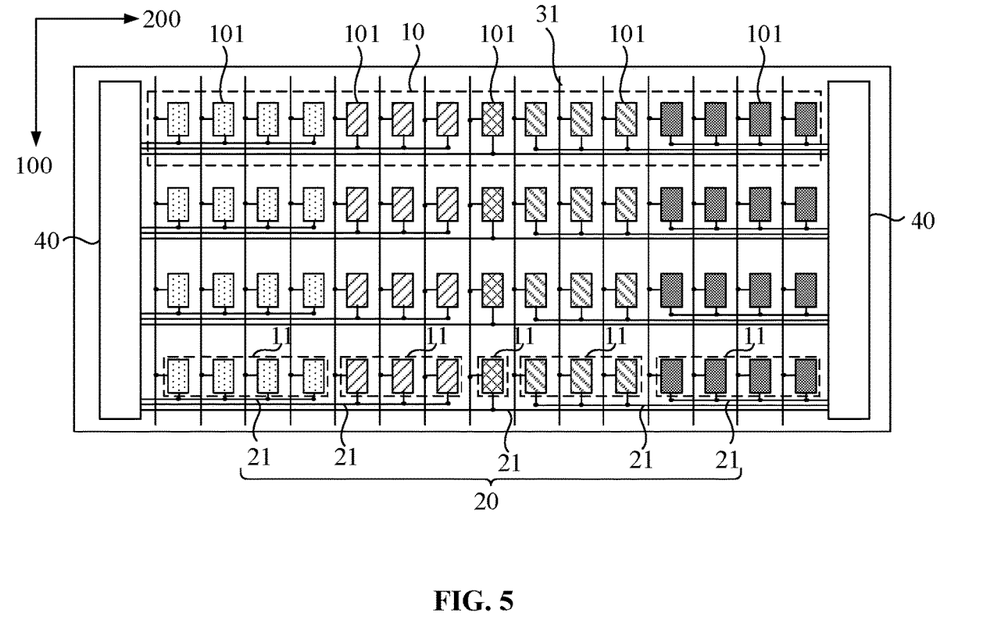
FIG. 5 is a diagram illustrating the structure of another array substrate according to an embodiment of the present disclosure.

It is also feasible to configure different pixel circuit rows 10 to be divided into different numbers of groups and configure the numbers and positions of pixel circuits 101 to be different in different pixel circuit groups 11. The number of pixel circuit groups 11 may be configured according to actual requirements. FIG. 5 is a diagram illustrating the structure of another array substrate according to an embodiment of the present disclosure. Referring to FIG. 5, in each pixel circuit row 10 of the array substrate, different pixel circuit groups 11 contain different numbers of pixel circuits 101. A scan line 21 has certain line impedance. When the scan line is relatively long and relatively far from the input terminal of a scan signal, the scan signal is attenuated by the line impedance. A pixel circuit group 11 in the intermediate region may be provided with a relatively small number of pixel circuits 101, preventing an excessive number of pixel circuits 101 in the intermediate region from being affected by line impedance. In a pixel circuit group 11 in an edge region, pixel circuits 101 are less affected by the line impedance of a scan line 21. Thus a larger number of pixel circuits 101 can be arranged in the pixel circuit group 11 in the edge region. The grouping method of each pixel circuit row may be designed according to actual requirements. The details are not described here.

Figure 6:
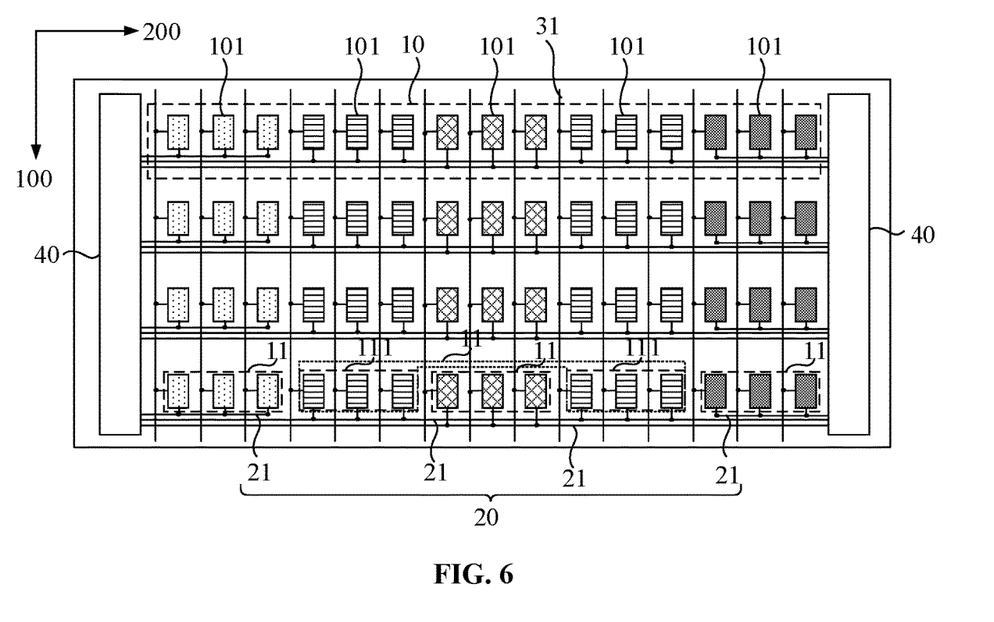
FIG. 6 is a diagram illustrating the structure of another array substrate according to an embodiment of the present disclosure.

FIG. 6 is a diagram illustrating the structure of another array substrate according to an embodiment of the present disclosure. Referring to FIG. 6, in the array substrate, in an embodiment, at least one pixel circuit group 11 includes multiple sub-pixel circuit groups 111, and each sub-pixel circuit group 111 includes multiple pixel circuits 101; all pixel circuits 101 in each sub-pixel circuit group 11l are in the same region, and pixel circuits 101 in different sub-pixel circuit groups 11 are in different regions. In the array substrate shown in FIG. 6, only one pixel circuit group 11 is provided with two sub-pixel circuit groups 111. Moreover, although the two sub-pixel circuit groups 111 are in different regions, pixel circuits 101 in the two sub-pixel circuits 111 are connected to the same scan line 21.

Figure 7:
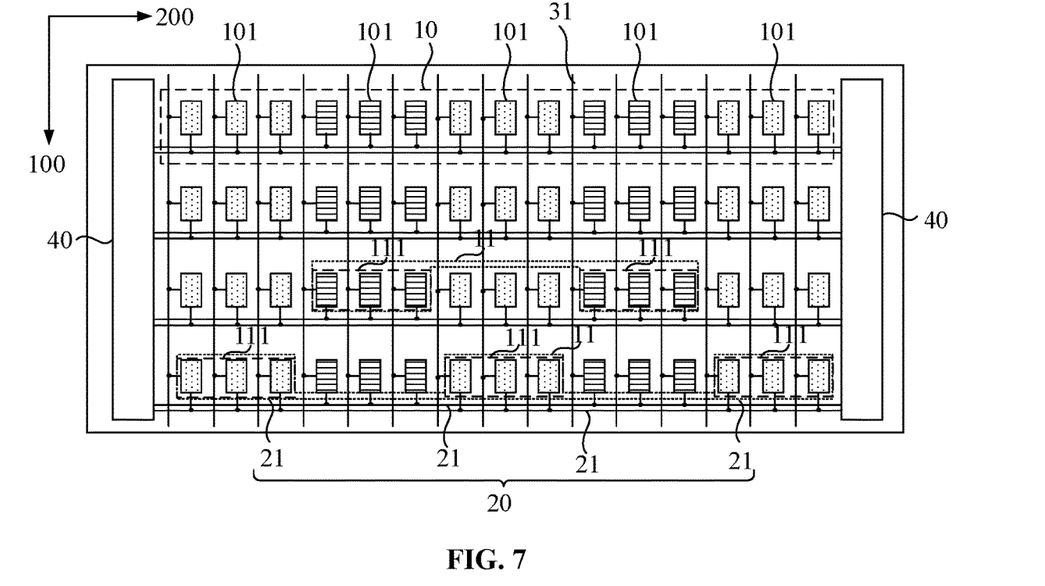
FIG. 7 is a diagram illustrating the structure of another array substrate according to an embodiment of the present disclosure.

In an embodiment, on this basis, it is also feasible to provide multiple sub-pixel circuit groups in at least two pixel circuit groups in each pixel circuit row. In this case, in different pixel circuit groups, sub-pixel circuit groups may be reasonably designed and changed in terms of arrangement according to actual requirements. FIG. 7 is a diagram illustrating the structure of another array substrate according to an embodiment of the present disclosure. Referring to FIG. 7, in the array substrate, in an embodiment at least two pixel circuit groups 11 each includes a plurality of sub-pixel circuit groups 111; and in each pixel circuit row 10, sub-pixel circuit groups 111 in different pixel circuit groups 11 are arranged alternately in sequence.

Figure 8:
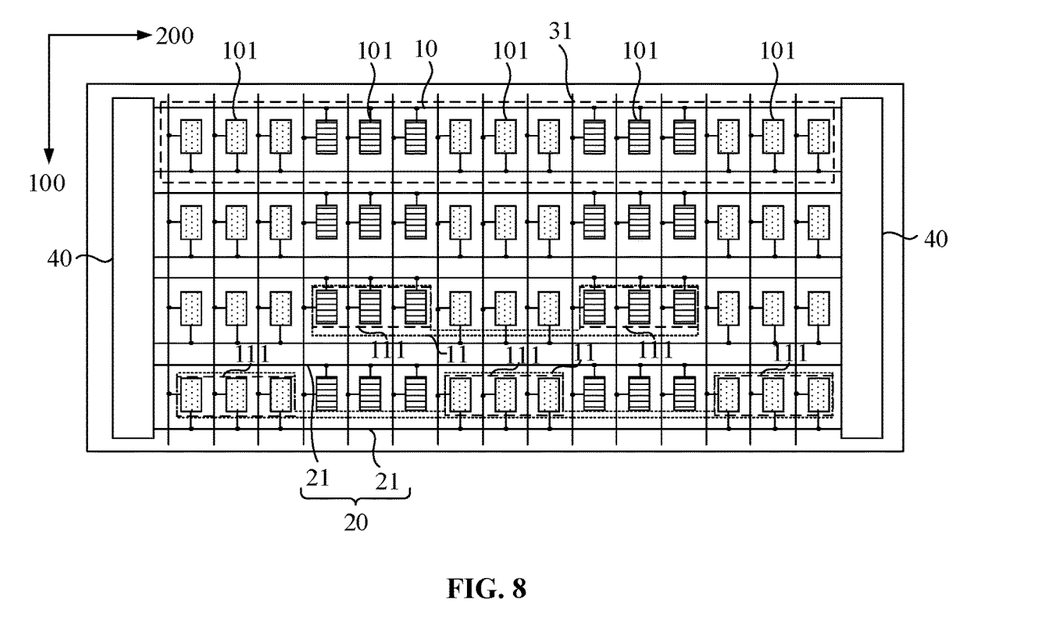
FIG. 8 is a diagram illustrating the structure of another array substrate according to an embodiment of the present disclosure.

In the preceding embodiment, scan lines 21 in the same scan line group 20 may be designed according to actual wiring requirements. Here, referring to FIGS. 3 to 7, in an embodiment, the at least two scan lines 21 in the same scan line group 20 may be arranged on the same side of the corresponding pixel circuit row 10. Of course, to avoid intersection of scan lines 21, referring to FIG. 2, in the column direction 100, the at least two scan lines 21 in the same scan line group 20 may be arranged on two sides of the corresponding pixel circuit row 10. FIG. 8 is a diagram illustrating the structure of another array substrate according to an embodiment of the present disclosure. It can be seen from a comparison between FIG. 6 and FIG. 8 that in the array substrate shown in FIG. 6, when a pixel circuit group 11 includes a plurality of sub-pixel circuit groups 111, and the sub-pixel circuit groups 111 are in different regions, the scan line 21 connected to this pixel circuit group easily intersects the scan line 21 connected to another pixel circuit group 11. That is, when pixel circuits 101 connected to different scan lines 21 are arranged alternately, when scan lines 21 in the same scan line group 20 are arranged on the same side of the corresponding pixel circuit row 10, insulation and intersection need to be achieved through a bridging process. In the array substrate shown in FIG. 8, possibly intersecting scan lines 21 are reasonably arranged on two sides of the corresponding pixel circuit row 10, thereby avoiding intersection of the scan lines 21, preventing insulation and intersection from being achieved through a relatively complex bridge, simplifying the manufacturing process of the scan lines 21, and reducing the costs.

Figure 9:
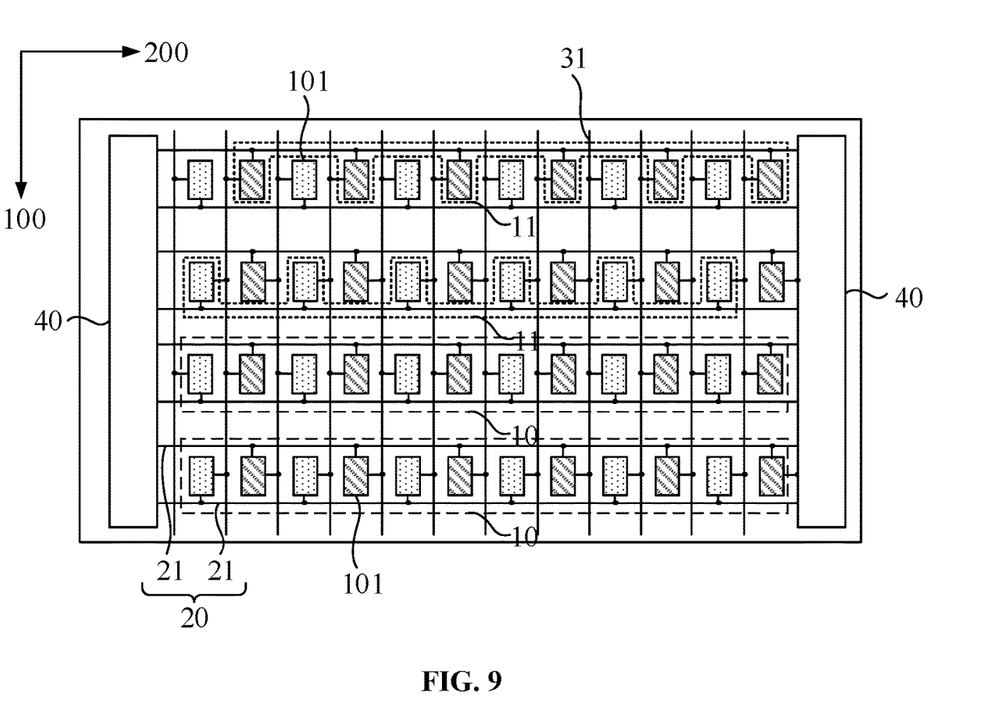
FIG. 9 is a diagram illustrating the structure of another array substrate according to an embodiment of the present disclosure.

When a data line is disposed in the array substrate, generally, the data line 31 may be disposed between two adjacent columns of pixel circuits 101. In addition to the arrangement shown in FIGS. 2 to 8 in which pixel circuits 101 in the same column are electrically connected to one data line 31, an embodiment of the present disclosure further provide an array substrate. FIG. 9 is a diagram illustrating the structure of another array substrate according to an embodiment of the present disclosure. Referring to FIG. 9, in addition to the preceding arrangement of data lines 31, the following arrangement is also feasible: Among pixel circuits 101 in the same column, pixel circuits 101 in odd-numbered rows are connected to one of two adjacent data lines 31, and pixel circuits 101 in even-numbered rows are connected to another one of the two adjacent data lines 31. In this case, simply when each pixel circuit 101 in each pixel circuit row 10 is electrically connected, in a one-to-one manner, one data line 31, can data signals be input through data lines 31 when pixel circuits 101 in this row are turned on. In this manner, charging is performed.

Figure 10:
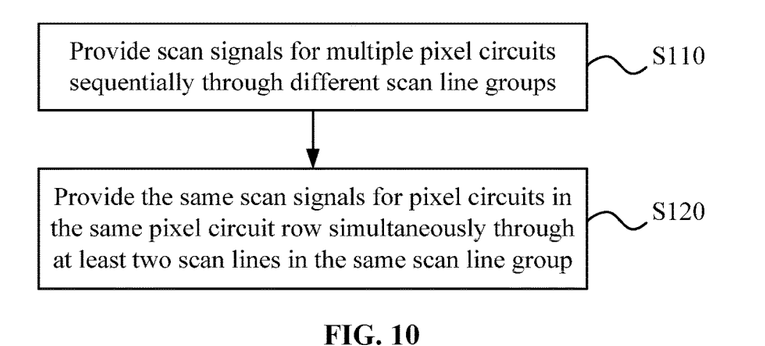
FIG. 10 is a flowchart of a driving method of a display panel according to an embodiment of the present disclosure.

An embodiment of the present disclosure provides various implementations for a scan driver circuit providing scan signals. With continued reference to FIGS. 2 to 8, the array substrate is provided with a scan driver circuit 40. The scan driver circuit 40 is electrically connected to scan lines 21 in each scan line group 20. The scan driver circuit 40 provides scan signals to different scan line groups 20 sequentially and provides scan signals to at least two scan lines 21 in the same scan line group 20 simultaneously. On this basis, an embodiment of the present disclosure further provide a driving method of a display panel. FIG. 10 is a flowchart of a driving method of a display panel according to an embodiment of the present disclosure. Referring to FIGS. 2 to 10, the driving method includes the steps below.

In S110, scan signals are provided for multiple pixel circuits sequentially through different scan line groups.

This step is essentially a process of progressive scanning of pixels in the display panel. After scanning of all rows is completed, the display panel can display one frame. When scan signals are provided for a pixel circuit row 10, the pixel circuit row 10 is turned on, and thus pixel circuits 101 in this pixel circuit row 10 can be provided with data signals.

In S120, the same scan signals are provided for pixel circuits in the same pixel circuit row simultaneously through at least two scan lines in the same scan line group.

This step is essentially a description of the process of scanning a row of pixel circuits. When scan signals are provided for a row of pixel circuits 101, in order that the duration in which each scan line 21 provides scan signals is maximized, different scan lines 21 provide scan signals synchronously and data lines 31 provide data signals synchronously to charge pixels. Each scan line 21 can fully utilize the scanning duration of this row of pixels to provide scan signals for pixel circuits 101, and data lines 31 fully charge the pixels.

When an image is driven to be displayed, with the configuration in which scan lines 21 in the same scan line group 20 provide scan signals for pixel circuits 101 in the corresponding pixel circuit row 10 simultaneously, it is ensured that pixel circuits 101 in the same row are turned on synchronously. Compared with the solution in which at least two scan lines 21 in the same scan line group 20 provide scan signals at different times, in the driving method of a display panel in an embodiment of the present disclosure, based on the fixed refresh rate of the display panel, it is ensured that the duration in which each scan line 21 provides scan signals is equal to the fixed total scanning duration of each row of pixel circuits 101. Thus it is ensured that each pixel circuit 101 can be charged sufficiently to ensure the charging effect.

Figure 11:
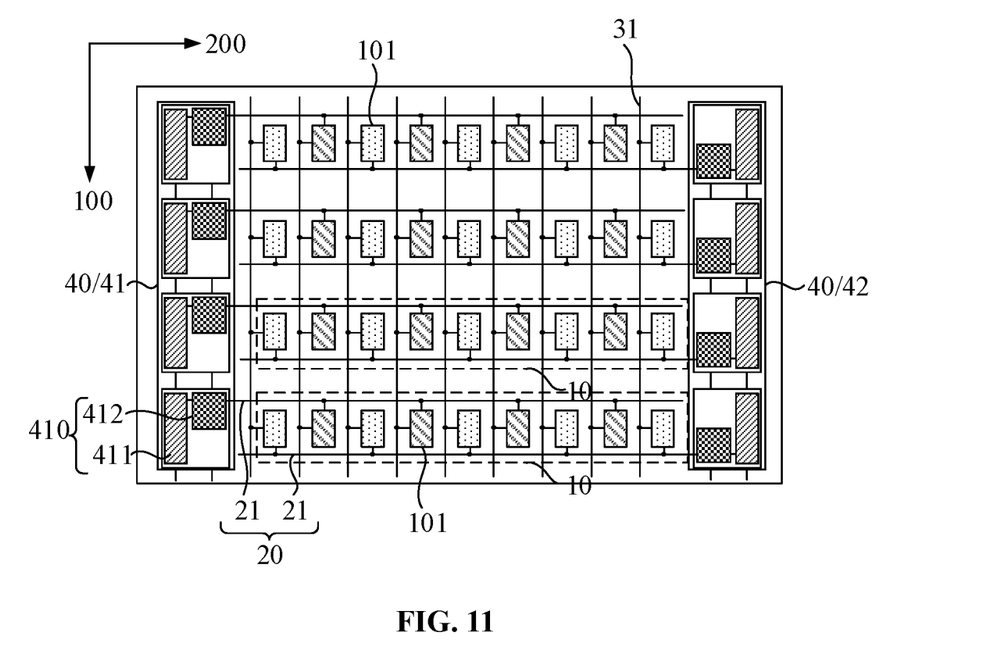
FIG. 11 is a diagram illustrating the structure of another array substrate according to an embodiment of the present disclosure.

FIG. 11 is a diagram illustrating the structure of another array substrate according to an embodiment of the present disclosure. Referring to FIG. 11, the scan driver circuit 40 includes a first scan driver circuit 41 and a second scan driver circuit 42. In the row direction 200, the first scan driver circuit 41 and the second scan driver circuit 42 are on two sides of the pixel circuits 101. The first scan driver circuit 41 and the second scan driver circuit 42 each includes a plurality of first shift register modules 410 cascaded to each other. The first shift register modules 410 in the first scan driver circuit 41 and the first shift register modules 410 in the second scan driver circuit 42 are each in one-to-one correspondence with the scan line groups 20. Each first shift register module 410 includes one shift register unit 411 and at least one enabling unit 412. The shift register unit 411 is electrically connected to the at least one enabling unit 412. At least one output terminal of the at least one enabling unit 412 is connected, in a one-to-one manner, to at least one scan line 21 in a same scan line group 20.

The first scan driver circuit 41 and the second scan driver circuit 42 are in the left region and the right region of the array substrate respectively. The first shift register modules 410 can perform shifting by using shift register units 411 so that scan signals are provided for multiple scan line groups 20 sequentially. In this manner, progressive scanning is performed. One enabling unit 412 is responsible for providing scan signals for the corresponding scan line 21 connected to the enabling unit 412. When all enabling units 412 corresponding to the same scan line group 20 receive the same shift signals provided by shift register units 411, these enabling units 412 can provide scan signals synchronously by being provided with the same clock signals. In this manner, synchronous scanning and charging of the same row of pixel circuits 101 is performed. The circuits of a shift register unit and an enabling unit may be reasonably designed based on the structure of a shift register module including a shift register unit and at least one enabling unit provided in an embodiment of the present disclosure. This is not limited in the embodiment of the present disclosure.

Figure 12:
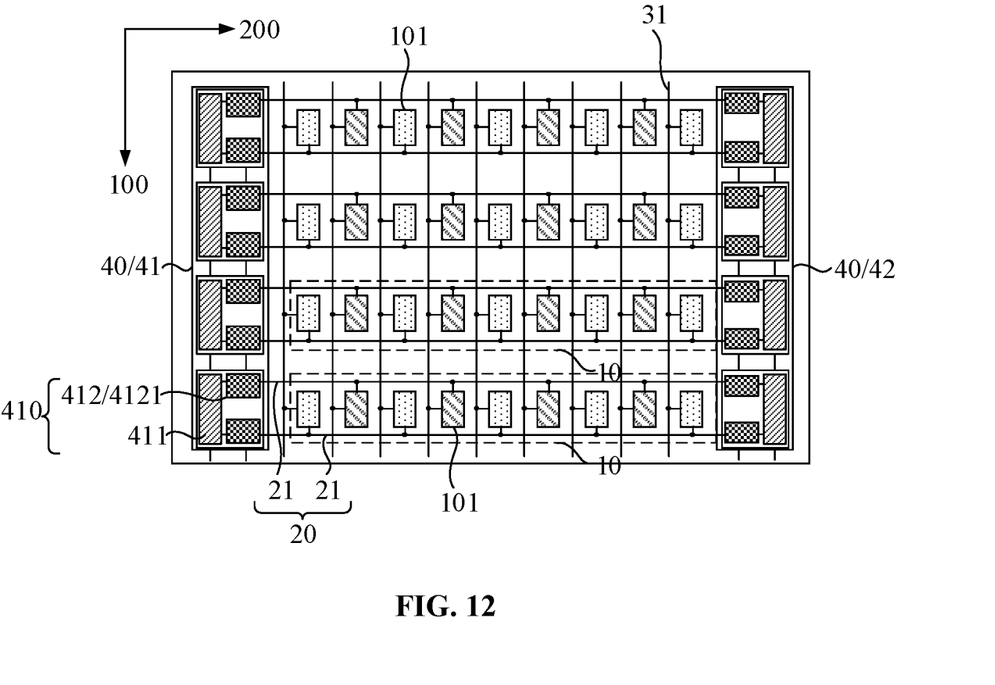
FIG. 12 is a diagram illustrating the structure of another array substrate according to an embodiment of the present disclosure.

FIG. 12 is a diagram illustrating the structure of another array substrate according to an embodiment of the present disclosure. Referring to FIG. 12, based on the array substrate shown in FIG. 11, one first shift register module 410 may be provided with at least one joint enabling unit 4121. In the first scan driver circuit 41 and the second scan driver circuit 42, the output terminals of the two joint enabling units 4121 in the two first shift register modules 41 corresponding to the same scan line group 20 are electrically connected, in a one-to-one manner, to two ends of the same scan line 21.

Figure 13:
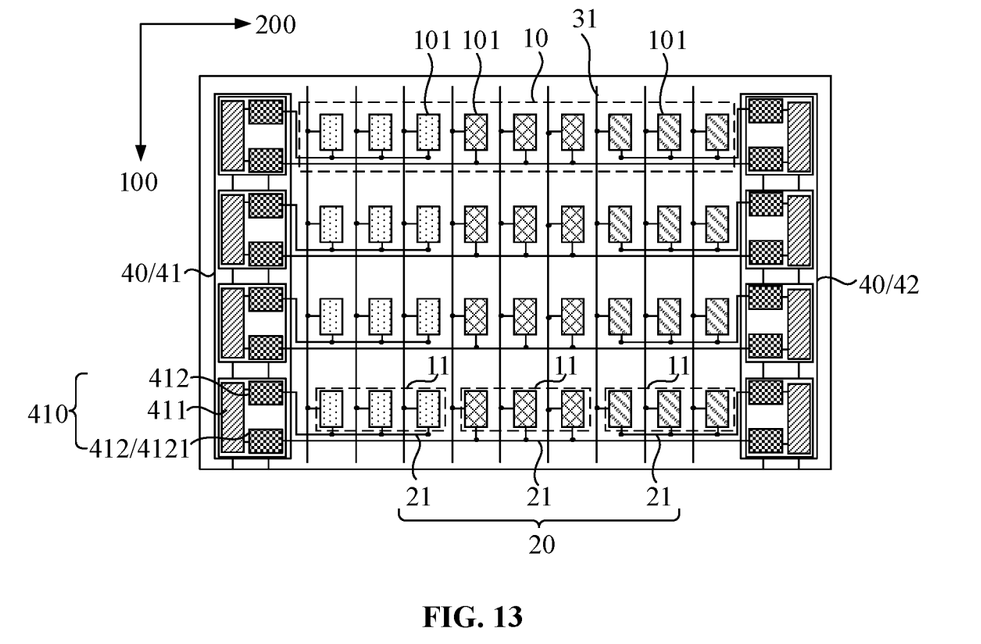
FIG. 13 is a diagram illustrating the structure of another array substrate according to an embodiment of the present disclosure.

An embodiment of the present disclosure further provides an array substrate. FIG. 13 is a diagram illustrating the structure of another array substrate according to an embodiment of the present disclosure. Referring to FIG. 13, in the array substrate, the first shift register module 410 includes at least one joint enabling unit 4121. In the first scan driver circuit 41 and the second scan driver circuit 42, the output terminals of the two joint enabling units 4121 in the two first shift register modules 41 corresponding to the same scan line group 20 are electrically connected, in a one-to-one manner, to two ends of the same scan line 21.

In the array substrate shown in FIGS. 12 and 13, the two joint enabling units 4121 provide scan signals to the same scan line 21. Therefore, clock signals and shift signals received by the two joint enabling units 4121 should be consistent. That is, through the same clock signals and shift signals, the two joint enabling units 4121 can be controlled to output the same scan signals. Each end of the same scan line 21 is connected to one joint enabling unit 4121, thereby avoiding the problem of attenuation of scan signals transmitted in the scan line 21 caused by line impedance, thus avoiding charging delay of pixel circuits 101 connected to the scan signal 21, and ensuring the charging effect.

Figure 14:
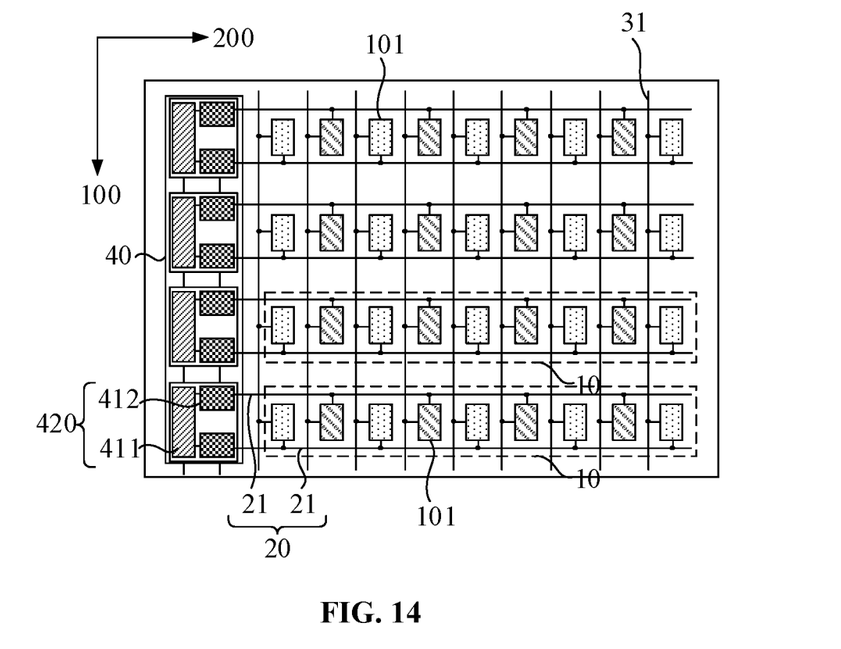
FIG. 14 is a diagram illustrating the structure of another array substrate according to an embodiment of the present disclosure.

FIG. 14 is a diagram illustrating the structure of another array substrate according to an embodiment of the present disclosure. Referring to FIG. 14, in the array substrate, the scan driver circuit 40 includes a plurality of second shift register modules 420 cascaded with each other. The second shift register modules 420 cascaded with each other are in one-to-one correspondence with the scan line groups 20. Each second shift register module 420 includes one shift register unit 411 and at least two enabling units 412. The shift register unit 411 is electrically connected to the at least two enabling units 412. Output terminals of the at least two enabling units 412 are electrically connected, in a one-to-one manner, to at least two scan lines 21 in a scan line group 20 corresponding to the at least two enabling units 412.

Figure 15:
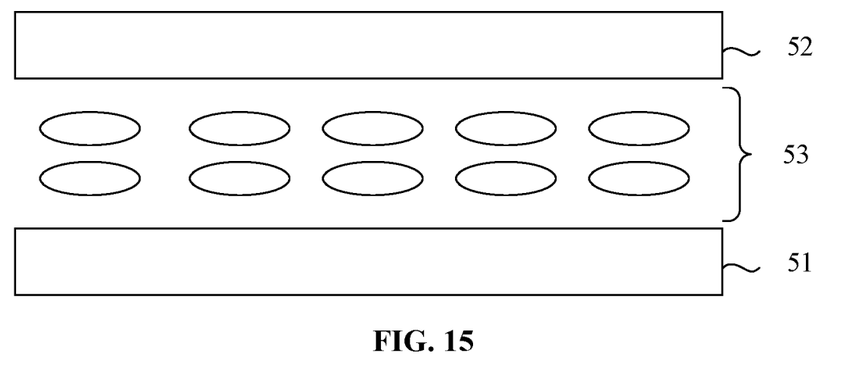
FIG. 15 is a diagram illustrating the structure of a display panel according to an embodiment of the present disclosure.

An embodiment of the present disclosure further provides a display panel. FIG. 15 is a diagram illustrating the structure of a display panel according to an embodiment of the present disclosure. Referring to FIG. 15, the display panel includes any array substrate 51 as described in the preceding embodiments. The display panel may be a liquid crystal display panel. That is, the display panel further includes a color film substrate 52 and a liquid crystal layer 53 between the array substrate 51 and the color film substrate 52.

Figure 16:
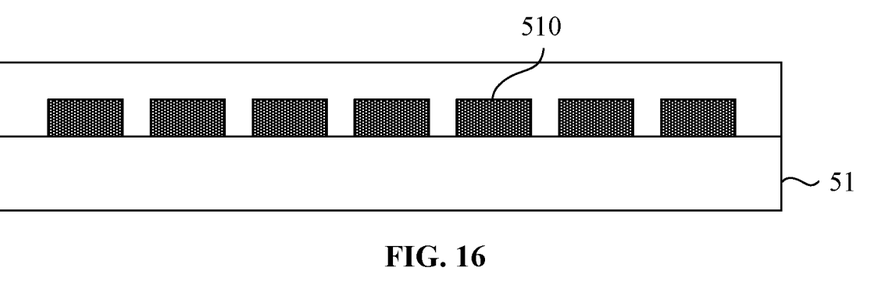
FIG. 16 is a diagram illustrating the structure of another display panel according to an embodiment of the present disclosure.

FIG. 16 is a diagram illustrating the structure of another display panel according to an embodiment of the present disclosure. Referring to FIG. 16, the display panel includes any array substrate 51 as described in the preceding embodiments. The display panel is an organic light-emitting display panel. The organic light-emitting display panel is further provided with a plurality of light-emitting units 510. The light-emitting units 510 are electrically connected, in a one-to-one manner, to pixel circuits on the array substrate 51.

In the display panel of an embodiment of the present disclosure, pixels may include red pixels, green pixels, and blue pixels. Each pixel is correspondingly driven by a pixel circuit in the preceding array substrate. The arrangement of the pixels is not limited to the array arrangement of the pixel circuits in the preceding array substrate. It is feasible to reasonably design an arrangement including multiple colors according to actual requirements. It is also feasible to reasonably design the color assortment of the pixels. For example, white pixels may be included. This is not limited herein. The display panel shown in FIGS. 15 and 16 is further provided with a circuit structure and an encapsulation structure that ensure normal operation of the display panel. Exemplarily in an embodiment in the organic light-emitting display panel, encapsulation may be implemented by a cover glass or a thin-film encapsulation layer to protect the light-emitting units 510 from being corroded by water vapor and thus from affecting the luminance efficiency.

In the display panel of an embodiment of the present disclosure, the array substrate 51 provided in the preceding embodiments is used, so each row of pixels can be divided, and the size of the load on each scan line can be restricted. Thus, the problem of charging delay caused by excessive load of the display panel is solved. With the configuration in which scan signals are provided for pixel circuits through multiple scan lines, it is ensured that each row of pixel circuits have a sufficient charging duration, and pixel circuits can be turned on accurately and timely. In this manner, charging delay of pixels can be avoided, and normal charging of pixels through pixel circuits and normal display of pixels are ensured.

Figure 17:
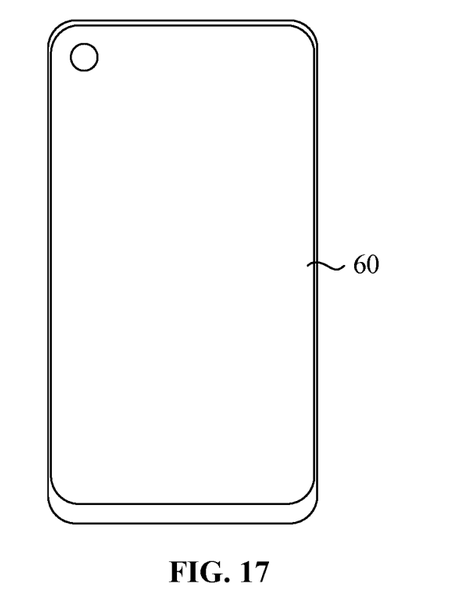
FIG. 17 is a diagram illustrating the structure of a display device according to an embodiment of the present disclosure.

An embodiment of the present disclosure further provides a display device. FIG. 17 is a diagram illustrating the structure of a display device according to an embodiment of the present disclosure. Referring to FIG. 17, the display device includes the display panel 60 provided in the preceding embodiments and has the same effects as the display panel 60 provided in the preceding embodiments. The display device may be, for example, a mobile phone, a tablet PC, a computer, or an intelligent wearable device.

What is claimed is:

1. An array substrate, comprising:
   a plurality of pixel circuit rows arranged in sequence in a column direction, wherein each pixel circuit row of the plurality of pixel circuit rows comprises a plurality of pixel circuits arranged in a row direction; and
   a plurality of scan line groups arranged in sequence in the column direction, wherein the plurality of scan line groups are in one-to-one correspondence with the plurality of pixel circuit rows,
   wherein the each pixel circuit row comprises a plurality of pixel circuit groups, each pixel circuit group of the plurality of pixel circuit groups comprise a plurality of pixel circuits in a same pixel circuit row of the plurality of pixel circuit rows, each scan line group of the plurality of scan line groups comprises a plurality of scan lines, each scan line of the plurality of scan lines extends in the row direction, the plurality of pixel circuit groups are in one-to-one correspondence with the plurality of scan lines in a scan line group corresponding to the plurality of pixel circuit groups, and all pixel circuits in the same pixel circuit group of the plurality of pixel circuit groups are connected to a same scan line in a scan line group corresponding to the same pixel circuit group;
   wherein the plurality of scan line groups provide scan signals sequentially for the plurality of pixel circuit rows in one-to-one correspondence with the plurality of scan line groups, and the plurality of scan lines in a same scan line group of the plurality of scan line groups provide scan signals simultaneously to pixel circuits correspondingly connected to the plurality of scan lines,
   wherein in the each pixel circuit row, all pixel circuits in each pixel circuit group of the plurality of pixel circuit groups are in a same region, and pixel circuits in different pixel circuit groups of the plurality of pixel circuit whips are in different regions,
   wherein in the each pixel circuit row, at least one pixel circuit group of the plurality of pixel circuit groups comprises a plurality of sub-pixel circuit groups, and each sub-pixel circuit group of the plurality of sub-pixel circuit groups comprises a plurality of pixel circuits;
   all pixel circuits in the each sub-pixel circuit group are in a same region, and pixel circuits in different sub-pixel circuit groups of the plurality of sub-pixel circuit groups are in different regions; and
   wherein all pixel circuits in a same region are adjacent to each other, and pixel circuits in different regions are not interweaved.

2. The array substrate of claim 1, wherein in the each pixel circuit row, the pixel circuits in different pixel circuit groups are arranged alternately in sequence.

3. The array substrate of claim 1, wherein in the each pixel circuit row, more than one pixel circuit group of the plurality of pixel circuit groups each comprises a plurality of sub-pixel circuit groups; and
   in the each pixel circuit row, sub-pixel circuit groups in different pixel circuit groups are arraigned alternately in sequence.

4. The array substrate of claim 1, wherein the each pixel circuit group contains a same number of pixel circuits.

5. The array substrate of claim 1, wherein in the column direction, the plurality of scan lines in a same scan line group are arranged on a same side of a pixel circuit row corresponding to the same scan line group; or
   in the column direction, the plurality of scan lines in a same scan line group are arranged on two sides of a pixel circuit row corresponding to the same scan line group.

6. The array substrate of claim 1, further comprising a plurality of data lines, wherein each data line of the plurality of data lines extends in the column direction, and pixel circuits in a same row are connected to different data lines of the plurality of data lines.

7. The array substrate of claim 6, wherein the each data line is between two adjacent columns of pixel circuits; and
   pixel circuits in a same column are electrically connected to a same data line of the plurality of data lines; or
   among the pixel circuits in a same column, pixel circuits in odd-numbered rows are connected to one of two adjacent data lines of the plurality of data lines, and pixel circuits in even-numbered rows are connected to the other one of the two adjacent data lines.

8. The array substrate of claim 1, further comprising a scan driver circuit electrically connected to the plurality of scan lines in the each scan line group,
wherein the scan driver circuit provides scan signals to different scan line groups of the plurality of scan line groups sequentially and provides scan signals to the plurality of scan lines in a same scan line group simultaneously.

9. The array substrate of claim 8, wherein the scan driver circuit comprises a first scan driver circuit and a second scan driver circuit; in the row direction, the first scan driver circuit and the second scan driver circuit are respectively arranged on two sides of a region where the plurality of the pixel circuit is located;
the first scan driver circuit and the second scan driver circuit each comprises a plurality of first shift register modules cascaded to each other, and the plurality of first shift register modules in the first scan driver circuit and the plurality of first shift register modules in the second scan driver circuit are each in one-to-one correspondence with the plurality of scan line groups; and
each first shift register module of the plurality of first shift register modules comprises one shift register unit and at least one enabling unit being electrically connected to the one shift register unit, and at least one output terminal of the at least one enabling unit is connected in a one-to-one manner, to at least one scan line in a scan line group corresponding to the each first shift register module.

10. The array substrate of claim 9, wherein the at least one enabling unit is each a joint enabling unit; and
in the first scan driver circuit and the second scan driver circuit, output terminals of two joint enabling units in two first shift register modules corresponding to a same scan line group are electrically connected, in a one-to-one manner, to two ends of each scan line in the same scan line group.

11. The array substrate of claim 8, wherein the scan driver circuit comprises a plurality of second shift register modules cascaded with each other, and the plurality of second shift register modules cascaded with each other are in one-to-one correspondence with the plurality of scan line groups; and
each second shift register module of the plurality of second shift register modules comprises one shift register unit and a plurality of enabling units, the shift register unit is electrically connected to the plurality of enabling units, and a plurality of output terminals of the plurality of enabling units are electrically connected, in a one-to-one manner, to a plurality of scan lines in a scan line group corresponding to the each second shift register module.

12. A driving method of a display panel, comprising:
providing scan signals for a plurality of pixel circuit rows sequentially through different scan line groups; and
providing same scan signals for pixel circuits in a same pixel circuit row simultaneously through a plurality of scan lines in a same scan line group,
wherein each pixel circuit row comprises a plurality of pixel circuit groups, each pixel circuit group of the plurality of pixel circuit groups comprise a plurality of pixel circuits in a same pixel circuit row of the plurality of pixel circuit rows, each scan line group of the plurality of scan line groups comprises a plurality of scan lines, each scan line of the plurality of scan lines extends in the row direction, the plurality of pixel circuit groups are in one-to-one correspondence with the plurality of scan lines in a scan line group corresponding to the plurality of pixel circuit groups, and all pixel circuits in the same pixel circuit group of the plurality of pixel circuit groups are connected to a same scan line in a scan line group corresponding to the same pixel circuit group;
wherein the plurality of scan line groups provide scan signals sequentially for the plurality of pixel circuit rows in one-to-one correspondence with the plurality of scan line groups, and the plurality of scan lines in a same scan line group of the plurality of scan line groups provide scan signals simultaneously to pixel circuits correspondingly connected to the plurality of scan lines,
wherein in the each pixel circuit row, all pixel circuits in each pixel circuit group of the plurality of pixel circuit groups are in a same region, and pixel circuits in different pixel circuit groups of the plurality of pixel circuit whips are in different regions,
wherein in the each pixel circuit row, at least one pixel circuit group of the plurality of pixel circuit groups comprises a plurality of sub-pixel circuit groups, and each sub-pixel circuit group of the plurality of sub-pixel circuit groups comprises a plurality of pixel circuits;
all pixel circuits in the each sub-pixel circuit group are in a same region, and pixel circuits in different sub-pixel circuit groups of the plurality of sub-pixel circuit groups are in different regions; and
wherein all pixel circuits in a same region are adjacent to each other, and pixel circuits in different regions are not interweaved.

13. A display panel, comprising an array substrate,
wherein the array substrate comprises:
a plurality of pixel circuit rows arranged in sequence in a column direction, wherein each pixel circuit row of the plurality of pixel circuit rows comprises a plurality of pixel circuits arranged in a row direction; and
a plurality of scan line groups arranged in sequence in the column direction, wherein the plurality of scan line groups are in one-to-one correspondence with the plurality of pixel circuit rows,
wherein the each pixel circuit row comprises a plurality of pixel circuit groups, each pixel circuit group of the plurality of pixel circuit groups comprise a plurality of pixel circuits in a same pixel circuit row of the plurality of pixel circuit rows, each scan line group of the plurality of scan line groups comprises a plurality of scan lines, each scan line of the plurality of scan lines extends in the row direction, the plurality of pixel circuit groups are in one-to-one correspondence with the plurality of scan lines in a scan line group corresponding to the plurality of pixel circuit groups, and all pixel circuits in the same pixel circuit group of the plurality of pixel circuit groups are connected to a same scan line in a scan line group corresponding to the same pixel circuit group;
wherein the plurality of scan line groups provide scan signals sequentially for the plurality of pixel circuit rows in one-to-one correspondence with the plurality of scan line groups, and the plurality of scan lines in a same scan line group of the plurality of scan line groups provide scan signals simultaneously to pixel circuits correspondingly connected to the plurality of scan lines,
wherein in the each pixel circuit row, all pixel circuit in each pixel circuit group of the plurality of pixel circuit groups are in a same region, and pixel circuits in difference pixel circuit groups of the plurality of pixel circuit groups are in different regions, wherein in the each pixel circuit row, at least one pixel circuit group of the plurality of pixel circuit groups comprises a plurality of sub-pixel circuit groups, and each sub-pixel circuit group of the plurality of sub-pixel circuit groups comprises a plurality of pixel circuits;

all pixel circuits in the each sub-pixel circuit are in a same region, and pixel circuits in different sub-pixel circuit groups of the plurality of sub-pixel circuit groups are in different regions; and wherein all pixel circuits in a same region are adjacent to each other, and pixel circuits in different regions are not interweaved.

14. The display panel of claim 13, wherein the display panel is a liquid crystal display panel, and the display panel further comprises a color film substrate and a liquid crystal layer between the array substrate and the color film substrate; or the display panel is an organic light-emitting display panel, the display panel further comprises a plurality of light-emitting units, and the plurality of light-emitting units are electrically connected, in a one-to-one manner, to a plurality of pixel circuits in the array substrate.

15. A display device, comprising the display panel of claim 13.

* * * * *